United States Patent
Zheng et al.

(10) Patent No.: US 11,287,457 B2
(45) Date of Patent: Mar. 29, 2022

(54) SYSTEM AND METHOD FOR MEASURING TIME-FREQUENCY CHARACTERISTIC OF HIGH-FREQUENCY ELECTROMAGNETIC SIGNAL

(71) Applicant: BEIHANG UNIVERSITY, Beijing (CN)

(72) Inventors: Zheng Zheng, Beijing (CN); Xin Zhao, Beijing (CN); Cui Li, Beijing (CN)

(73) Assignee: BEIHANG UNIVERSITY, Beijjing (CN)

( * ) Notice: Subject to any disclaimer, the term of this patent is extended or adjusted under 35 U.S.C. 154(b) by 307 days.

(21) Appl. No.: 16/605,540

(22) PCT Filed: May 11, 2018

(86) PCT No.: PCT/CN2018/086573
§ 371 (c)(1),
(2) Date: Oct. 16, 2019

(87) PCT Pub. No.: WO2018/206006
PCT Pub. Date: Nov. 15, 2018

(65) Prior Publication Data
US 2020/0124650 A1    Apr. 23, 2020

(30) Foreign Application Priority Data

May 12, 2017 (CN) .......................... 201710332990.2

(51) Int. Cl.
*G01R 23/17* (2006.01)
(52) U.S. Cl.
CPC .................................. *G01R 23/17* (2013.01)
(58) Field of Classification Search
CPC ... G01R 23/17; H01S 3/08086; H01S 3/1118; H01S 3/06791; G02F 2/002; G02F 2203/54
See application file for complete search history.

(56) References Cited

U.S. PATENT DOCUMENTS

| 2004/0017833 A1* | 1/2004 | Cundiff | H01S 3/1112 372/18 |
| 2009/0174931 A1* | 7/2009 | Huber | H01S 3/06791 359/340 |

(Continued)

FOREIGN PATENT DOCUMENTS

| CN | 106093598 | * 11/2016 | |
| WO | WO-2012049680 A1 * | 4/2012 | G01R 19/0053 |

OTHER PUBLICATIONS

Zhao, Xin et al., An electromagnetic signal property measuring system and method, Nov. 2016 (Year: 2016).*

(Continued)

*Primary Examiner* — Giovanni Astacio-Oquendo
*Assistant Examiner* — Carl F. R. Tchatchouang
(74) *Attorney, Agent, or Firm* — Tribute IP Solutions; Qun Li

(57) ABSTRACT

This invention disclosed a system and method for characteristics measurement of electromagnetic signals. The measurement system comprises a multi-repetition-rate pulsed light source, a frequency mixer for electrical signal and optical signal, and a data acquisition and processing device. The measurement system accurately determines the characteristic information of the signal to be measured, such as frequency, phase, intensity, and their variations, by measuring the low frequency mixed signal generated by the multi-repetition-rate pulsed light source and the signal to be measured in the frequency mixer. This system has the advantages of simple structure, high measurement accuracy, low cost and large measurable frequency range. The system can be applied to the measurement of various electromagnetic signals, covering the spectral range from microwave, millimeter wave, to terahertz and even light wave.

11 Claims, 8 Drawing Sheets

(56) References Cited

U.S. PATENT DOCUMENTS

2016/0043810 A1* 2/2016 Quinlan ............... H04B 10/90
398/208
2018/0115136 A1* 4/2018 Delfyett ............... H01S 3/1121

OTHER PUBLICATIONS

Yasui, T., et al., Real-time absolute frequency measurement of continuous-wave terahertz radiation based on dual terahertz combs of photocarriers with different frequency spacings. Optics Express. 23(9): p. 11367.

Zhao, X., et al., Dead-band-free, high-resolution microwave frequency measurement using a free-running triple-comb fiber laser. IEEE Journal of Selected Topics in Quantum Electronics, 2018. 24(3): p. 1-8.

Nguyen, L.V.T. and D.B. Hunter, A photonic technique for microwave frequency measurement. IEEE Photonics Technology Letters, 2006. 18(9-12): p. 1188-1190.

Chi, H., X. Zou, and J. Yao, An Approach to the Measurement of Microwave Frequency Based on Optical Power Monitoring. IEEE Photonics Technology Letters, 2008. 20(14): p. 1249-1251.

Sarkhosh, N., et al., Reduced Cost Photonic Instantaneous Frequency Measurement System. IEEE Photonics Technology Letters, 2008. 20(17-20): p. 1521-1523.

Zou, X.H. and J.P. Yao, An Optical Approach to Microwave Frequency Measurement With Adjustable Measurement Range and Resolution. IEEE Photonics Technology Letters, 2008. 20(21-24): p. 1989-1991.

Bui, L.A., et al., Instantaneous frequency measurement system using optical mixing in highly nonlinear fiber. Optics Express, 2009. 17(25): p. 22983-22991.

Li, J.Q., et al., Photonic-assisted microwave frequency measurement with higher resolution and tunable range. Optics Letters, 2009. 34(6): p. 743-745.

Zou, X.H., et al., Photonic Instantaneous Frequency Measurement Using a Single Laser Source and Two Quadrature Optical Filters. Ieee Photonics Technology Letters, 2011. 23(1): p. 39-41.

Marpaung, D., On-Chip Photonic-Assisted Instantaneous Microwave Frequency Measurement System. IEEE Photonics Technology Letters, 2013. 25(9): p. 837-840.

* cited by examiner

SYSTEM AND METHOD FOR MEASURING TIME-FREQUENCY CHARACTERISTIC OF HIGH-FREQUENCY ELECTROMAGNETIC SIGNAL

FIELD OF THE INVENTION

The invention relates to the field of measurement, and particularly relates to a system and method for time-frequency characteristic measurement of high-frequency electromagnetic signals.

BACKGROUND OF THE INVENTION

The characteristic measurement of electromagnetic signal is of great importance to scientific research, industrial measurement, modern communication, military scouting and other applications. At present, the commonly used system for measuring the characteristic of high-frequency electromagnetic signal usually utilizes a down-conversion method to convert the high-frequency signal into a low-frequency signal, and then performs measurement. However, for signals with unknown frequency range or broadband signals, it is often impossible to determine the ratio of down-conversion and to select fixed down-conversion devices for accurate measurement, especially for signals with large frequency range.

Pulsed laser source can output optical pulses with a constant time period. In frequency domain, its spectrum is composed of a series of frequency comb teeth with fixed intervals which are the repetition rates of the optical pulses $f_r$. The electromagnetic signal with unknown frequency can mix with the adjacent comb tooth from these frequency comb teeth whose frequency is $mf_r$, and then is down-converted in the frequency band to below $f_r/2$. We can measure the characteristics of the down-converted low frequency signal, such as frequency, amplitude, phase or their variation. The spectral bandwidth of the pulsed laser is wide to easily cover a large range of electromagnetic spectrum compared to the modulated electrical-optical combs which have limited number of spectral comb lines.

However, some information is needed for determining the characteristics of the electromagnetic signal to be measured. Firstly, the repetition rates of the optical pulses need to be measured accurately. In addition, it is necessary to determine which frequency comb line mixes with the electromagnetic signal to be measured, that is, the value of m. However, when only one optical pulse signal is used to obtain one down-converted signal, the value of m can't be determined. If more than three optical pulse trains with different repetition rates can mix with the electromagnetic signal at the same time, more than three down-converted beat signals can be obtained. Then the relative position in frequency axis between the signal to be measured and the adjacent comb line can be determined uniquely, and the value of m can be calculated. Thus, the related information of the electromagnetic signal to be measured can be obtained.

A single pulsed laser can simultaneously output more than three optical pulse trains with different repetition rates in the same laser cavity by utilizing differences in modal dispersion, polarization mode dispersion, birefringence, chromatic dispersion, non-linear effect or mode-locking mechanism. When a multi-repetition-rate pulsed laser source realized using the above mechanism is applied to the measurement of electromagnetic signal characteristics, the frequency, amplitude, phase, and their variations of single-frequency or time-varying or wide-spectrum signals can be measured accurately. In comparison with traditional electromagnetic measurement methods, this system has the advantages of simpler structure and better integration.

SUMMARY OF THE INVENTION

In view of the problems in the prior art, this invention provides a system and method for time-frequency characteristic measurement of high-frequency electromagnetic signals.

This invention provides a system for time-frequency characteristics measurement of high frequency electromagnetic signals. The system comprises a multi-repetition-rate pulsed light source, a frequency mixer for electrical signal and optical signal, a repetition-rate measurement device, and a data acquisition and processing device. The multi-repetition-rate pulsed light source contains a single laser cavity and simultaneously generates three or more optical pulse trains with different repetition rates. All the optical pulse trains transmit through the same optical path in the laser cavity. The generated three or more optical pulse trains with different repetition rates form three or more different frequency combs, where the frequency intervals of the frequency comb lines are equal to the repetition rates of the corresponding optical pulse trains. The multi-repetition-rate pulse trains generated by the multi-repetition-rate pulsed light source and the signal to be measured are mixed in the frequency mixer, and three or more mixed signals are respectively generated. The repetition-rate measurement device measures the repetition rate of each optical pulse train emitted by the multi-repetition-rate pulsed light source in real time. The data acquisition and processing device simultaneously acquires the mixed frequency signals generated by the frequency mixer and the repetition rates measured by the repetition-rate measurement device. After data processing, the relative position of the frequency of the signal to be measured and the comb lines of each optical frequency combs can be determined, thereby obtaining the time-frequency characteristics of the signal to be measured.

In one exemplary embodiment, the multi-repetition-rate pulsed light source contains only one laser cavity, in which more than three optical pulse trains with different repetition rates are generated simultaneously. Due to the reason that these optical pulse trains have different modes, polarization states, center wavelengths, transmission directions, or non-linear effects, the optical pulse trains are not spatially separated in the laser cavity, and the light beams of the pulse trains overlap with each other in the laser cavity. The optical pulse trains have different transmission delays or phase delays due to their different modal dispersion, polarization mode dispersion, birefringence, chromatic dispersion, non-linear effect or mode-lock mechanism in the optical cavity, which enables the simultaneous generation of several optical pulse trains with different repetition rates in one single laser cavity. In the frequency domain, the optical pulse train with a fixed repetition-rate is a series of frequency comb lines spaced by the repetition-rate, so that the multi-repetition-rate pulse trains generated by the multi-repetition-rate pulsed light source are multiple sets of optical combs composed of frequency lines with different frequency intervals.

In one exemplary embodiment, the multi-repetition-rate pulsed light source can be a mode-locked laser. By utilizing the differences in modal dispersion, polarization-mode dispersion, birefringence, chromatic dispersion, nonlinear effects, or mode locking mechanism in the laser cavity, multiple optical pulse trains with different repetition rates can be generated by a single pulsed light source.

In one exemplary embodiment, the multi-repetition-rate pulsed light source can be a fiber laser, a solid-state laser, or an on-chip laser based on waveguide devices.

In one exemplary embodiment, the multi-repetition-rate pulsed light source can also be realized by a micro-resonator. Using a continuous-wave pump light source, the micro-resonator can generate multi-repetition-rate pulse trains by nonlinear optical effects, such as Kerr effect. This kind of multi-repetition-rate pulsed light source can output optical pulse trains with different repetition rates simultaneously by utilizing the slight difference in refractive index, i.e., the modal dispersion or polarization-mode dispersion between different resonant modes in the micro-resonator.

In one exemplary embodiment, the signal to be measured incorporates various spectral bands, from millimeter wave to light wave. The signal can be single-frequency signal, frequency-varying signal or broad band signal.

In one exemplary embodiment, the frequency mixer is a combination of an optical frequency mixer and a photodetector, or a photoconductive antenna. The frequency mixed signals are generated by mixing the signal to be measured with the comb line of each multi-repetition-rate optical pulse train respectively, which is closest to the frequency of the signal to be measured. Therefore, the frequencies of the frequency mixed signals are no more than half of the repetition rates of the corresponding pulse trains.

In one exemplary embodiment, each multi-repetition-rate optical pulse train can be mixed with the signal to be measured by different optical frequency mixers or photoconductive antennas or by the same optical frequency mixer or photoconductive antenna. The output of different optical frequency mixer can be detected by different photodetectors respectively or by the same photodetector. When only one optical frequency mixer or photoconductive antenna or photodetector is used, different mixed signals are differentiated by an algorithm according to their amplitude, frequency and other characteristics.

In one exemplary embodiment, the frequency mixer can have a low-pass filter, an amplifier or a low-bandwidth amplifier to filter and amplify the output signals of the photoconductive antenna or photodetector, so as to meet the requirements of the data acquisition and processing device for the input electrical signal. When the signal to be measured is an electromagnetic signal in the terahertz band, the frequency mixer can be a photoconductive antenna or a nonlinear crystal or a nonlinear device, which mixes the terahertz signal and the multi-repetition-rate pulse trains generated by the multi-repetition-rate pulsed light source in the frequency domain. When the signal to be measured is a microwave signal in other spectral bands, the frequency mixer can be a combination of optical frequency mixer and photodetector.

In one exemplary embodiment, the optical mixer can be an optical intensity modulator, an optical phase modulator, an optical polarization modulator, a nonlinear crystal, a nonlinear optical fiber, a nonlinear waveguide, an acousto-optic modulator, a magneto-optical modulator, an optical coupler, an optical filter, and their combinations.

In one exemplary embodiment, the repetition-rate measuring device accurately measures the repetition rate of each optical pulse train from the multi-repetition-rate pulsed light source in real time.

In one exemplary embodiment, the repetition-rate measurement device is omitted if the repetition-rate information of each optical pulse train from the multi-repetition-rate pulsed light source is known.

In one exemplary embodiment, the repetition-rate measurement device is a photodetector and frequency counter.

In one exemplary embodiment, the repetition-rate measurement device includes a reference frequency source, an optical frequency mixer and a photodetector. The frequency mixed signals are generated by mixing the multi-repetition-rate pulse trains and the reference frequency signal in the optical frequency mixer and the low bandwidth frequency mixed signals are detected by the photodetectors. Here 'low bandwidth' means that the frequencies are less than half of the maximum repetition rates of the optical pulse trains. The information including repetition rate, relative amplitude and phase of each optical pulse train is obtained by processing the low bandwidth frequency mixed signal with devices such as pulse counter, frequency meter or a data acquisition and processing algorithm.

In one exemplary embodiment, the data acquisition and processing device calculates the frequency, amplitude, phase or their variations of the signal to be measured in accordance to the repetition rate of each pulse train generated by the multi-repetition-rate pulsed light source and the frequency, amplitude and phase of the more than three frequency mixed signals generated by the frequency mixer.

The invention provides a method for time-frequency characteristic measurement of high frequency electromagnetic signals by the steps of:

Step 1, providing a multi-repetition-rate pulsed light source for simultaneously generating three or more optical pulse trains with different repetition rates using a single optical cavity, wherein the light beams of all the optical pulse trains overlap with each other in the optical cavity, the three or more optical pulse trains with different repetition rates form three or more different optical frequency combs, wherein the frequency intervals of the frequency combs are equal to the repetition rates of the corresponding optical pulse trains;

Step 2, inputting the multi-repetition-rate optical pulse trains generated by the multi-repetition-rate pulsed light source and the signal to be measured into a frequency mixer to obtain three or more frequency mixed signals between the signal to be measured and the multi-repetition-rate pulse trains, wherein the frequencies of the frequency mixed signals are not larger than half of the repetition rates of the corresponding optical pulse trains;

Step 3, inputting the multi-repetition-rate optical pulse trains generated by the multi-repetition-rate pulsed light source into a repetition-rate measurement device to obtain the repetition rate information of each optical pulse train;

Step 4, providing a data acquisition and processing device for obtaining the frequency domain characteristics of the frequency, amplitude, phase or their variations of the three or more frequency mixed signals generated by the frequency mixer based on their time domain characteristics, and calculating spectrum information of the signal to be measured, including the frequency, amplitude, phase distribution or their variations in accordance to the repetition rate information of the optical pulse trains generated by the multi-repetition-rate pulsed light source and the frequency domain characteristics of the three or more frequency mixed signals generated by the frequency mixer.

In one exemplary embodiment, the data acquisition and processing device uniquely determines the relative position between the frequency of the signal to be measured and the frequency comb line in frequency domain accordance to the repetition rate information of each optical pulse train emitted by the multi-repetition-rate pulsed light source and the frequencies of the three or more frequency mixed signals generated by the frequency mixer.

In one exemplary embodiment, the signal to be measured is a time-varying signal, and the data acquisition and processing device can uniquely determine the time-varying frequency characteristics of the signal to be measured in accordance to the repetition rate information of each pulse trains of the multi-repetition-rate pulsed light source and the time-varying frequency domain characteristics of the three or more mixed signals generated by the frequency mixer.

In one exemplary embodiment, the signal to be measured has wide bandwidth, and the data acquisition and processing device determines the frequency domain distribution characteristics of the signal to be measured in accordance to the repetition rate information of each optical pulse train emitted by the multi-repetition-rate pulsed light source and the spectral shape of the three or more frequency mixed signals generated by the frequency mixer.

In one exemplary embodiment, the data acquisition and processing device acquires the frequency mixed signals and obtains the frequency domain information by processing the signal using algorithms. The algorithms include but are not limited to one or combinations of: FIR filter, IIR filter, fast convolution, Fourier Transform, Fourier Inverse Transform, Short-Time Fourier Transform, Wavelet Transform, Hilbert Transform, Hilbert-Huang Transform, sine curve fitting, Ricker wavelet matching, S Transform, Cohen bilinear transformation and adaptive filtering methods. For measurement of broad band signal, the algorithm also includes the maximum likelihood estimation and other algorithms.

DETAILED DESCRIPTION

The following paragraphs will describe the technical solutions of the proposed invention with the reference figures. Obviously, the following exemplary embodiments are only parts of the embodiments of the proposed system and method, not all of them. The following exemplary embodiments all use a triple-wavelength pulsed laser as the multi-repetition-rate pulsed light source, but all the light sources satisfying the following requirements can be used as a multi-repetition-rate pulsed light source in the exemplary embodiments: the multi-repetition-rate pulsed light source contains only one oscillation cavity, and it simultaneously generates more than three optical pulse trains with different repetition rates. The generated optical pulse trains have different modes, polarization states, center wavelengths, transmission directions, or nonlinear effects. The optical pulse trains are not spatially separated in the laser cavity, and the light beams of the optical pulse trains overlap with each other in the laser cavity. Thus, the optical pulse trains have different transmission delay or phase delay due to their different modal dispersion, polarization mode dispersion, birefringence, chromatic dispersion, nonlinear effect or mode-lock mechanism in the laser cavity, which enables the simultaneous generation of several optical pulse trains with different repetition rates in one single laser cavity.

Embodiment 1

Figure 1:
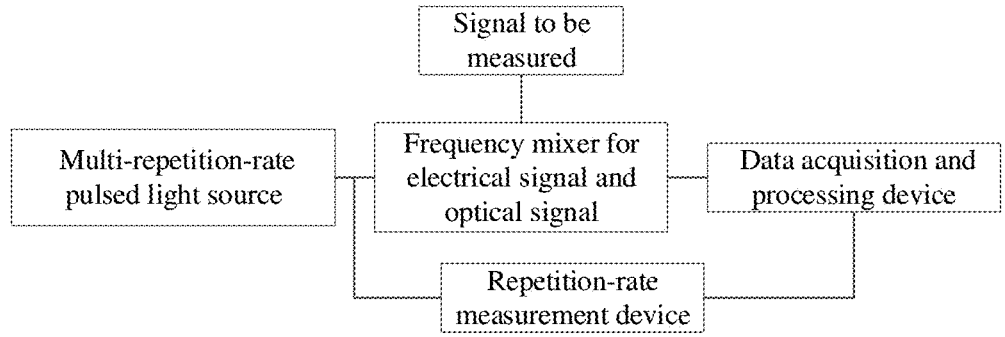
FIG. 1 is a schematic diagram of the system.
Figure 2:
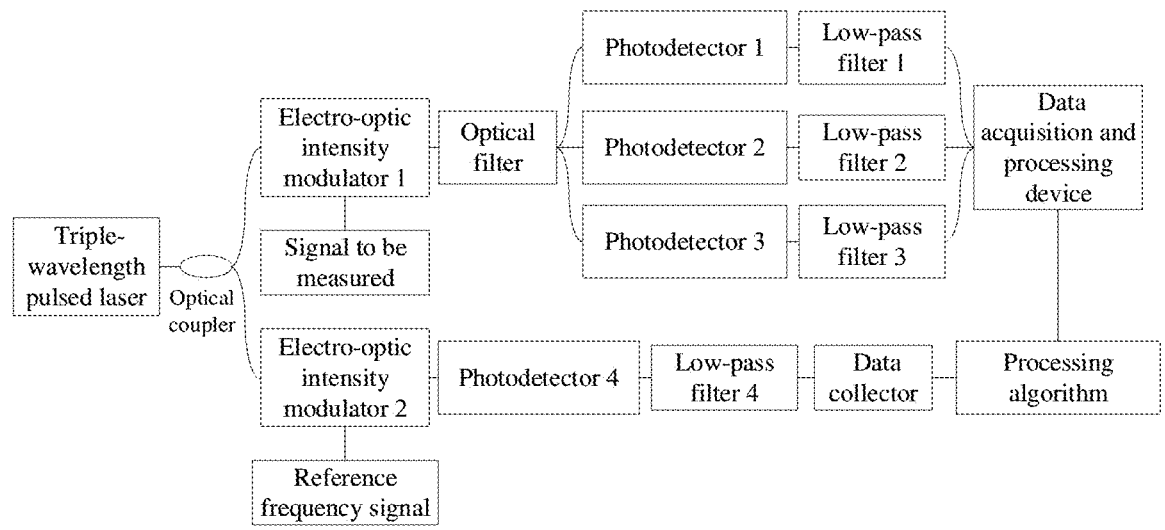
FIG. 2 is the schematic diagram of embodiment 1.

The schematic diagram is shown in FIG. 2. In this embodiment, frequency domain characteristic measurement of a single frequency signal is realized.

Figure 3:
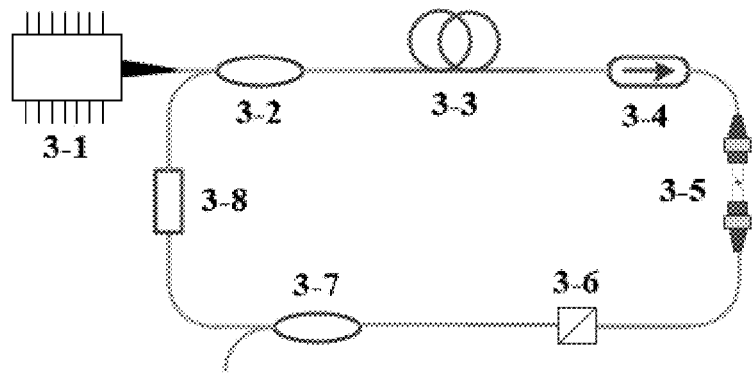
FIG. 3 is the schematic diagram of a triple-wavelength pulsed laser, in which 3-1 is a pump laser, 3-2 is a wavelength-division multiplexer, 3-3 is an erbium-doped fiber, 3-4 is an optical isolator, 3-5 is a carbon nanotube saturable absorber, 3-6 is an in-line polarizer with two polarization maintaining fiber pigtails at both ends, 3-7 is an optical coupler, and 3-8 is a polarization controller.

In this embodiment, the multi-repetition-rate pulsed light source is a triple-wavelength pulsed laser. The laser consists of one optical laser cavity in which three optical pulse trains with different repetition rates are generated simultaneously. The light beams of all optical pulse trains overlap completely in the laser cavity. The repetition rates of the three pulse trains are different due to their different spectral central wavelengths and chromatic dispersion of the optical laser cavity. In this embodiment, the structure of a triple-wavelength pulsed laser is shown in FIG. 3. The laser consists of a pump laser 3-1, a wavelength division multiplexer 3-2, erbium-doped fiber 3-3, an optical isolator 3-4, a carbon nanotube saturable absorber 3-5, an in-line polarizer with polarization-maintaining fiber pigtail 3-6, an optical coupler 3-7 and a polarization controller 3-8. The connection order of the devices can be adjusted. In the triple-wavelength pulsed laser, the carbon nanotube saturable absorber 3-5 is a mode-locking device to achieve passively mode-locking; the polarization controller 3-8 and in-line polarizer 3-6 can achieve periodic spectrum filtering effect, thus triple-wavelength pulse trains generation can be achieved.

Figure 4:
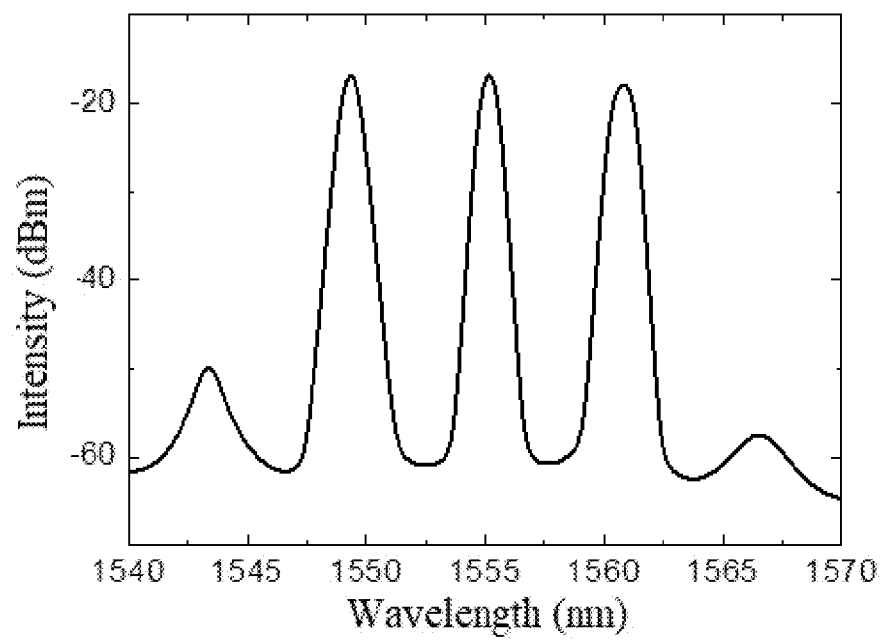
FIG. 4 is the output spectrum of a triple-wavelength pulsed laser.
Figure 5:
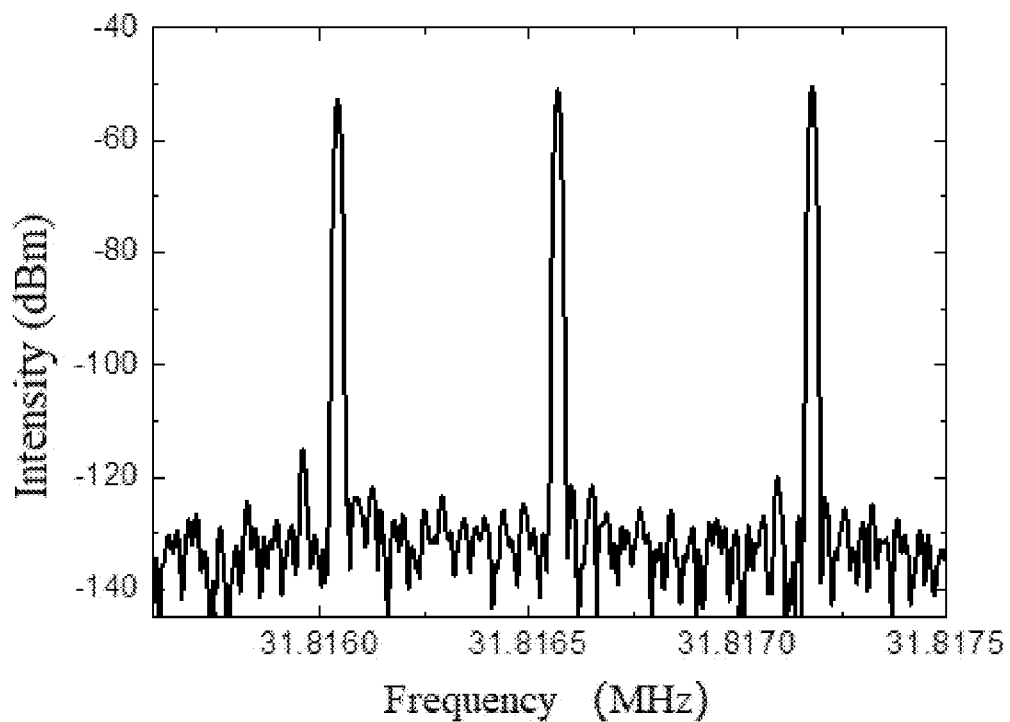
FIG. 5 is the RF spectrum of the triple-wavelength pulse measured by a photodetector and a spectrum analyzer.

In this embodiment, the spectra of the three optical pulse trains with different repetition rates generated simultaneously by the triple-wavelength pulsed laser are shown in FIG. 4. The three peaks in the center of the spectrum correspond to the three optical pulse trains with different repetition rates output by the laser. The three optical pulse trains have different central wavelengths, which are $\lambda_1 = 1560.82$ nm, $\lambda_2 = 1555.18$ nm and $\lambda_3 = 1549.33$ nm. The spectral bandwidths of the three optical pulse trains are $BW_1 = 0.98$ nm, $BW_2 = 0.71$ nm, $BW_3 = 0.76$ nm. The corresponding central wavelength differences are $\Delta\lambda_{12} = 5.64$ nm and $\Delta\lambda_{23} = 5.85$ nm. The repetition rates of the optical pulse trains are $f_1$, $f_2$ and $f_3$, corresponding to the center wavelength of $\lambda_1$, $\lambda_2$ and $\lambda_3$. In this embodiment, the total dispersion in the laser cavity of the triple-wavelength pulsed laser is anomalous, thus $f_1 < f_2 < f_3$. The RF spectrum of the laser output measured by a photodetector and a spectrum analyzer is shown in FIG. 5. It is shown that the repetition rates of the optical pulse trains corresponding to three different wavelengths are $f_1 = 31.816042$ MHz, $f_2 = 31.816569$ MHz, $f_3 = 31.817179$ MHz, the differences of the repetition rates are $\Delta f_{12} = 527$ Hz and $\Delta f_{23} = 610$ Hz.

In this embodiment, the frequency mixer consists of an electro-optic intensity modulator 1, an optical filter, a photodetector 1, a low-pass filter 1, a photodetector 2, a low-pass filter 2, a photodetector 3 and a low-pass filter 3. The electro-optic intensity modulator 1 can be replaced by one or combinations of phase modulator, polarization modulator, non-linear crystal, non-linear optical fiber, non-linear waveguide, acousto-optic modulator and magneto-optic modulator. Each of the combinations of photodetectors 1 and low-pass filter 1, photodetectors 2 and low-pass filter 2, photodetectors 3 and low-pass filter 3 can be replaced by one or more low-bandwidth photodetector. If the frequency of the signal to be measured is in terahertz range, the frequency mixers can be one or more photoconductive antennas. It is also possible not to use optical filters and to replace the three combinations of photodetectors and low pass filters with one or two combinations of photodetectors and low pass filters or one or two low bandwidth photodetectors. If the frequency of the signal to be measured is in terahertz range, it can also be replaced by one or two photoconductive antennas. If the multi-repetition-rate pulsed light source uses polarization mode dispersion to generate optical pulse trains with different repetition rates, the optical filter can also be replaced by a polarization controller. The characteristic of the frequency mixer is that it uses multiple frequency combs generated by the optical pulse trains with different repetition rates to down convert the signal to a low frequency for measurement. In the frequency mixing process, the information of frequency, amplitude and phase of the signal to be measured are retained.

In this embodiment, the pulse repetition-rate measurement device is composed of electro-optic intensity modulator 2, reference frequency signal, photodetector 4, low-pass filter 4, data acquisition device and signal processing algorithm. The data acquisition device and signal processing algorithm can be replaced by one or more frequency counters. The pulse repetition-rate measurement device can be replaced by an optical filter, one or more photodetectors and a frequency counter. The device can also be replaced by a photodetector and a RF spectrum analyzer. The device can also be replaced by a photodetector and a frequency counter. If the pre-measured pulse repetition-rate value can be directly input to the data acquisition and processing device, the pulse repetition-rate measurement device can also be omitted.

In this embodiment, the signal to be measured is a single frequency electromagnetic signal. It can also be an electromagnetic signal with multiple frequency components.

In this embodiment, the data acquisition and processing device includes a data acquisition unit and a data processing unit. The sampling rate of the data acquisition unit is far less than the frequency of the signal to be measured, but not less than the maximum repetition rates of the output optical pulse trains of the multi-repetition-rate pulsed light source. The data processing unit uses Hilbert transform to process the output signal of the frequency mixer and obtains the frequency value of the signal to be measured. It can also use one or a combination of of FIR filter, IIR filter, fast convolution, Fourier transform, inverse Fourier transform, short-time Fourier transform, wavelet transform, Hilbert transform, Hilbert-Huang transform, sine curve fitting, Ricker wavelet matching, S transform, Cohen transform to process the output signal of the frequency mixer to obtain the frequency, amplitude, phase, spectrum, amplitude spectrum and phase spectrum of the signal to be measured.

Figure 6:
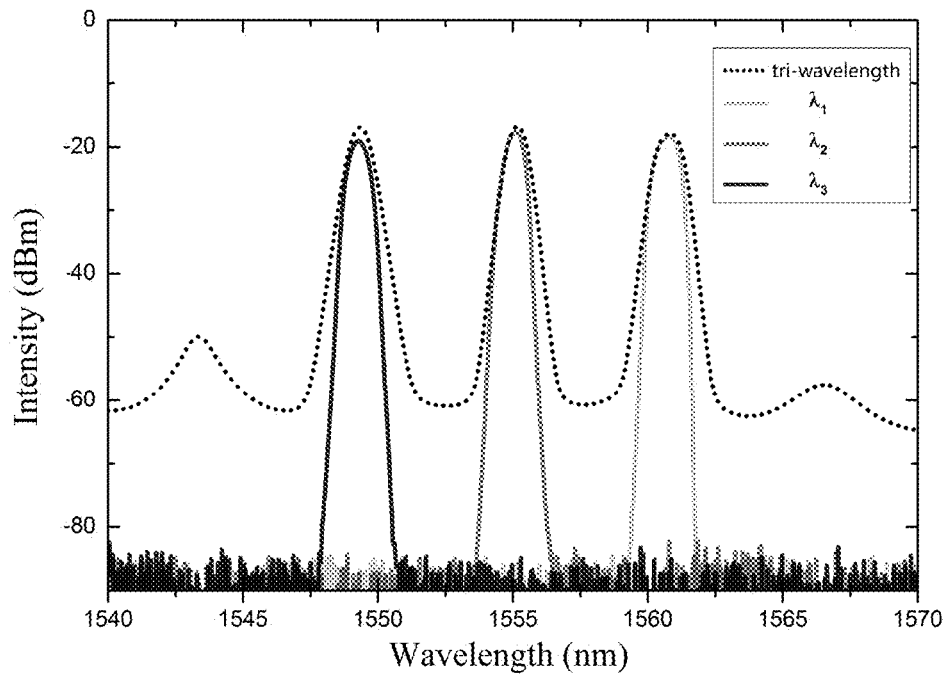
FIG. 6 is the spectra of the triple-wavelength pulses after being separated by the optical filter in embodiment 1.

In this embodiment, three optical pulse trains with different repetition rates generated by triple-wavelength pulsed laser are split into two parts through the optical coupler. One part enters into the electro-optic intensity modulator 1, in which the three optical pulse trains are modulated by the signal to be measured, and then filtered by the optical filter to separate the modulated three-wavelength optical pulse trains. The separated spectra are shown in FIG. 6. The repetition rates of the three optical pulse trains corresponding to the central wavelengths of $\lambda_1$, $\lambda_2$ and $\lambda_3$ are $f_1$, $f_2$, and $f_3$ respectively. The optical pulse train with the center wavelength $\lambda_1$ is detected by the photodetector 1 and then passes through the low pass filter 1 to obtain the frequency mixed signal 1. The optical pulse train with the center wavelength $\lambda_2$ is detected by the photodetector 2 and then passes through the low pass filter 2 to obtain the frequency mixed signal 2. The optical pulse light with the center wavelength $\lambda_3$ is detected by the photodetector 3 and then passes through the low pass filter 3 to obtain the frequency mixed signal 3. Frequency mixed signal 1, 2 and 3 is input into the data acquisition and processing device at the same time. The other part of the output light from the triple-wavelength pulsed laser input into the electro-optic intensity modulator 2 to be modulated by the reference frequency signal $f_{ref}$ and detected by the photodetector 4. The electrical signal passes through the low-pass filter 4 and enters the data acquisition unit. After data processing, the repetition rates $f_1$, $f_2$, $f_3$ of the three optical pulse trains are obtained. Then the information of repetition rates is input into the data acquisition and processing device. The data acquisition and processing device processes $f_1$, $f_2$, $f_3$, and the mixed signals 1, 2, and 3 to obtain one or more parameters of the frequency, amplitude, phase, spectrum, amplitude spectrum, and phase spectrum of the signal to be measured.

In this embodiment, the cut-off frequency of the electro-optic intensity modulator is not less than the maximum frequency of the input electromagnetic signal. In this embodiment, the bandwidth of the electro-optic intensity modulator 1 for inputting the signal to be measured is 40 GHz, and that of the electro-optic intensity modulator 2 for inputting the reference frequency signal is 10 GHz. The cut-off frequency of the photodetector is much lower than the frequency of the signal to be measured, but not less than half of the repetition rates of the optical pulse trains output by the multi-repetition-rate pulsed light source. In this embodiment, the bandwidth of the photodetector is 150 MHz, which is far less than the frequency of the signal to be measured and larger than half of the repetition rates of the output pulse trains generated by the triple-wavelength pulse source. The cut-off frequency of the low-pass filter is not less than half of the repetition rates of the output optical pulse trains generated by the multi-repetition-rate pulsed light source. In this embodiment, in order to avoid signal aliasing after sampling, the cut-off frequency of the low-pass filter is not higher than half of the sampling frequency of the data acquisition and processing device. The low-pass filter is not necessary if the one or more combinations of low-pass filter, high-pass filter, band-pass filter and band-stop filter are selected in the data processing method. The sampling rate of the data acquisition and processing device is not less than the maximum value of the repetition rates of the output optical pulse trains of the multi-repetition-rate pulsed light source. In this embodiment, the sampling rate is not less than $f_3$, and the acquired data is processed by an algorithm.

In this embodiment, three optical pulse trains with different repetition rates are modulated by reference frequency signal in electro-optic intensity modulator 2. Three frequency combs corresponding to the three optical pulse trains with different repetition rates generated by the triple-wavelength pulsed light source can down convert the frequency of the reference signal to a lower frequency. By measuring the frequencies of the beat note signals of the reference signal and the comb lines and using the known frequency value of the reference frequency signal, the repetition rates of three optical pulse trains can be calculated. In this embodiment, the repetition rates of the corresponding frequency combs are calculated by measuring the mixed frequencies of the reference frequency signal and the adjacent comb lines from the optical frequency combs. The repetition rates of the corresponding combs can also be calculated by measuring the mixed frequencies of the reference frequency signal and the second adjacent comb lines from the optical frequency combs.

In this embodiment, the reference frequency signal is a sinusoidal signal with a frequency $f_{ref}$ of 5985 MHz and power of 0 dBm. The approximate repetition rates of the three optical pulse trains are 31.817 MHz. The results show that the comb lines from the three optical pulse trains, which are adjacent to the reference signal $f_{ref}$ are all the 188th line of each comb, which means n=188. The frequencies of the 188th comb lines from the optical frequency combs respectively generated by the three optical pulse trains are smaller than the frequency of the reference signal, which means $nf_1 < nf_2 < nf_3 < f_{ref}$.

In this embodiment, the output signal of the electro-optic intensity modulator 2 is detected by the photodetector 4, and then passes through the low pass filter 4, and the output of the low pass filter 4 is input into the data acquisition device. At one certain moment, the data acquisition device samples and acquires the output signal of the low-pass filter 4 at a sampling rate of 50 MHz, and processes the data using a Hilbert transform algorithm to obtain the frequencies of the beat note signal $f_{br1}$, $f_{br2}$, $f_{br3}$ which are generated by mixing of the reference frequency signal $f_{ref}$ and the adjacent comb lines in the optical frequency combs corresponding to the three optical pulse trains respectively. One or more methods of FIR filter, IIR filter, fast convolution, Fourier transform, inverse Fourier transform, short-time Fourier transform, wavelet transform, Hilbert transform, Hilbert-Huang transform, sine curve fitting, Ricker wavelet matching, S transform, Cohen bilinear transform, adaptive filtering can also be used to process data to get one or more characteristics of frequency, amplitude, phase, frequency spectrum, amplitude spectrum, phase spectrum of the beat note signal between the reference signal $f_{ref}$ and the adjacent optical frequency comb line or the second adjacent optical frequency comb line of the three optical pulse trains respectively.

In this embodiment, the reference signal mixes with the adjacent comb lines of the optical frequency combs generated by the three optical pulse trains respectively. Thus the frequencies of the beat note signals are calculated to be $f_{br1}$=3.58432768 MHz>$f_{br2}$=3.48521223 MHz>$f_{br3}$=3.37057943 MHz, where $f_{br1}$=$f_{ref}$−$nf_1$, $f_{br2}$=$f_{ref}$−$nf_2$, $f_{br3}$=$f_{ref}$−$nf_3$ and $f_{ref}$=5985 MHz, n=188. The repetition rates of the three optical pulse trains at the moment are calculated to be $f_1$=31.81604081 MHz, $f_2$=31.81656796 MHz, $f_3$=31.81717776 MHz, respectively. The values of $f_1$, $f_2$, $f_3$ are sent to the data acquisition and processing device. The repetition rates of three optical pulse trains at the current moment can also be calculated by the beat note signals between the reference signal $f_{ref}$ and the second adjacent comb lines of the optical frequency combs generated by the three optical pulse trains respectively.

In this embodiment, at the same moment, the data acquisition and processing device acquires the output signals of low-pass filter 1, low-pass filter 2 and low-pass filter 3 from the frequency mixer at 50 MHz sampling rate. The data acquisition and processing device performs Hilbert transform on the acquired data, and calculates the mean value of the frequency within 10 ms as the instantaneous frequency value at that moment. The frequencies of the beat note signals generated by the reference signal and the adjacent optical comb lines from the three optical pulse trains are $f_{b1}$=9.76318559 MHz, $f_{b2}$=9.59765969 MHz, $f_{b3}$=9.40618054 MHz, respectively. One or more methods of FIR filter, IIR filter, fast convolution, Fourier transform, inverse Fourier transform, short-time Fourier transform, wavelet transform, Hilbert transform, Hilbert-Huang transform, sine curve fitting, Ricker wavelet matching, S transform, Cohen bilinear transform, adaptive filtering can also be used to process the data to get one or more characteristics of frequency, amplitude, phase, frequency spectrum, amplitude spectrum, phase spectrum of the beat note signals which are formed respectively by mixing the reference signal and the adjacent optical comb lines in the frequency combs generated by the three optical pulse trains respectively.

In this embodiment, the frequency mixing signals are generated by three optical pulse trains with different repetition rates and the reference frequency signal in the electro-optic intensity modulator 1. Through frequency mixing process, three optical frequency combs generated by three optical pulse trains with different repetition rates from the triple-wavelength pulse source down convert the signal to be measured to a low frequency for measurement, and the frequency, amplitude, phase spectrum, amplitude spectrum and phase spectrum information of the signal to be measured are retained. In this embodiment, the adjacent or second adjacent comb lines of the signal to be measured are the same order comb line of the three frequency combs generated by three optical pulse trains. The comb line order is marked as m. By measuring the frequencies of the low-frequency beat note signals generated by mixing the signal to be measured with the frequency combs from different optical pulse trains and calculating the sum or difference of the above beat note signals frequencies, then comparing them with the repetition rates and repetition rates difference of the three optical pulse trains measured by the repetition-rate measurement device, the value of m can be calculated and the relative position in the frequency axis of the frequency of the signal to be measured and the optical frequency combs respectively generated by the three optical pulse trains is determined. Thus the frequency of the signal to be measured is determined. The frequency, amplitude and phase information of different frequency components in the signal to be measured can also be calculated by measuring the frequency, amplitude and phase of the low frequency beat note signals which are generated by mixing the signal to be measured and the frequency combs respectively generated by different optical pulse trains.

Figure 7:
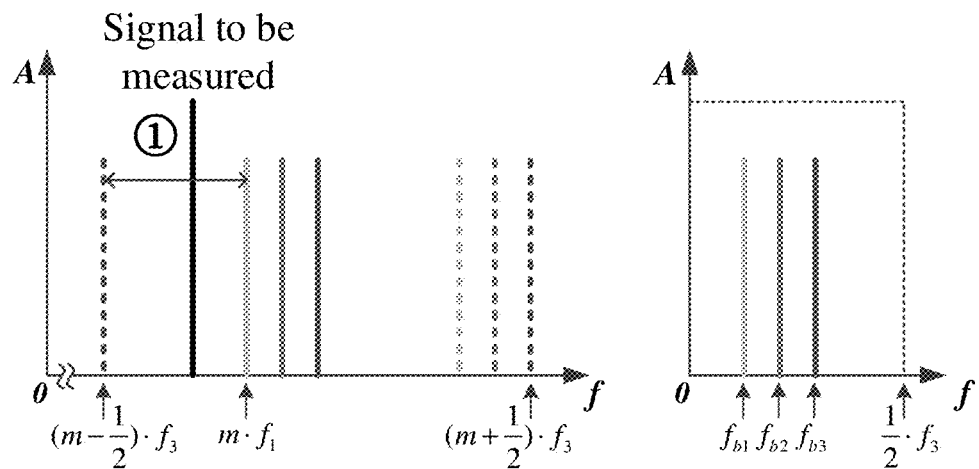
FIG. 7 shows the relative position between the signal to be measured and the m-th order comb lines in the frequency comb of the three optical pulses under the first condition in embodiment 1 and the RF spectrum of the low frequency down converted signal.
Figure 8:
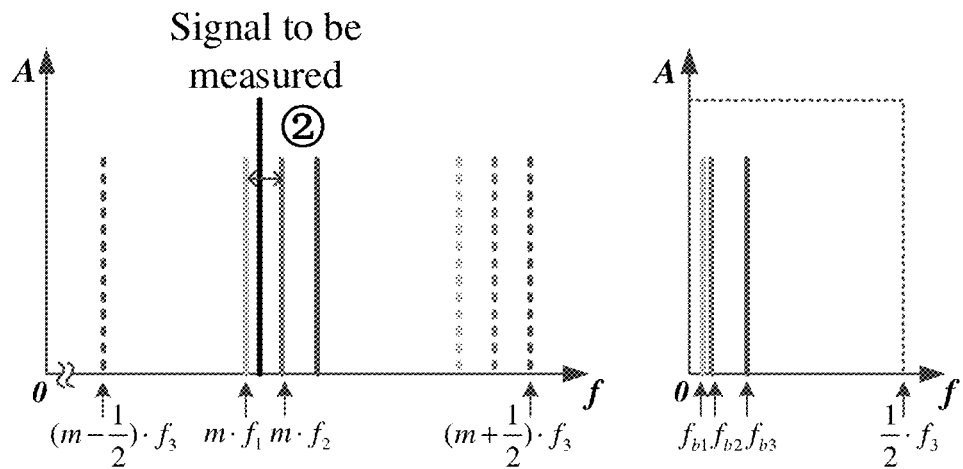
FIG. 8 shows the relative position between the signal to be measured and the m-th order comb lines in the frequency comb of the three optical pulses under the second condition in embodiment 1 and the RF spectrum of the low frequency down converted signal.
Figure 9:
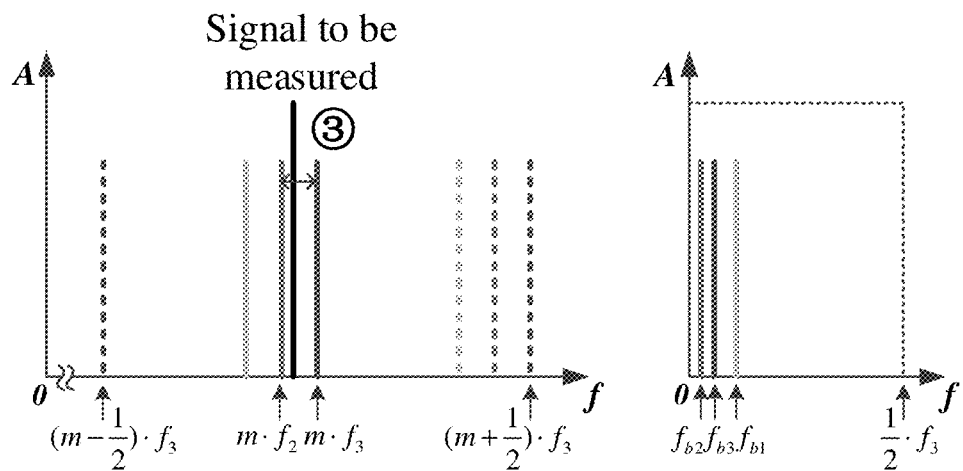
FIG. 9 shows the relative position between the signal to be measured and the m-th order comb lines in the frequency comb of the three optical pulses under the third condition in Embodiment 1 and the RF spectrum of the low frequency down converted signal.
Figure 10:
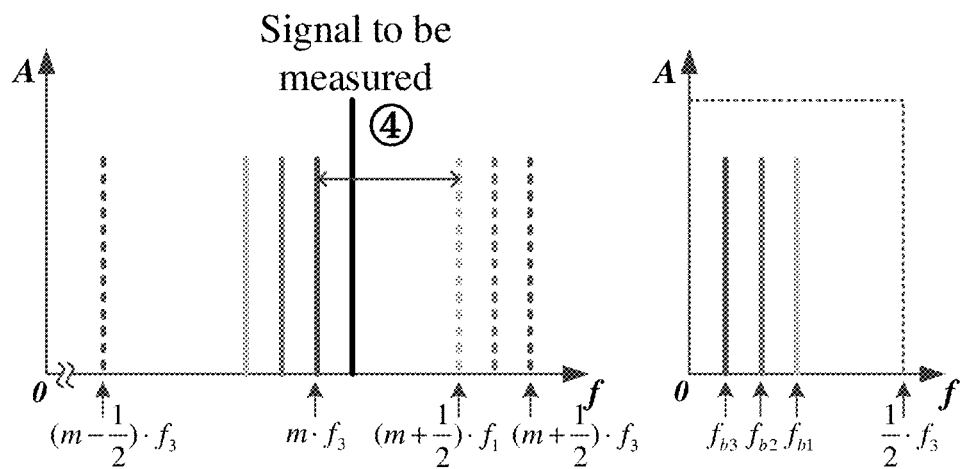
FIG. 10 shows the relative position between the signal to be measured and the m-th order comb lines in the frequency comb of the three optical pulses under the fourth condition in Embodiment 1 and the RF spectrum of the low frequency down converted signal.
Figure 11:
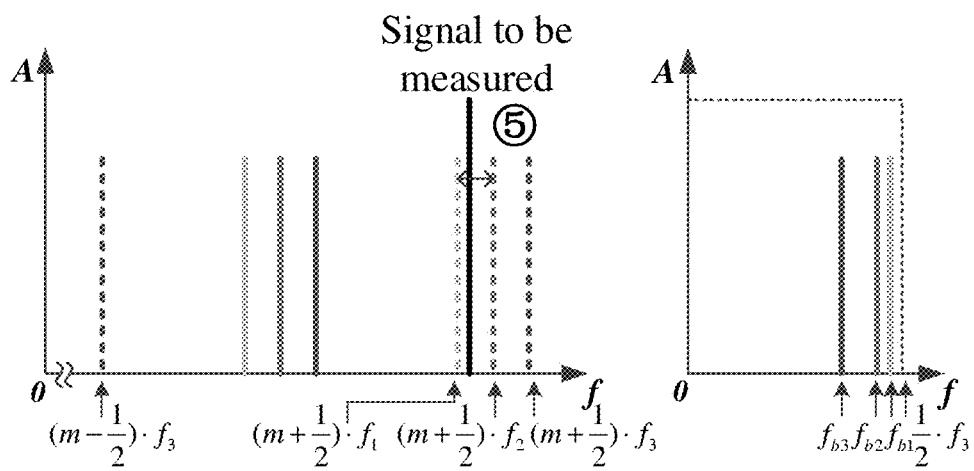
FIG. 11 shows the relative position between the signal to be measured and the m-th order comb lines in the frequency comb of the three optical pulses under the fifth condition in Embodiment 1 and the RF spectrum of the low frequency down converted signal.
Figure 12:
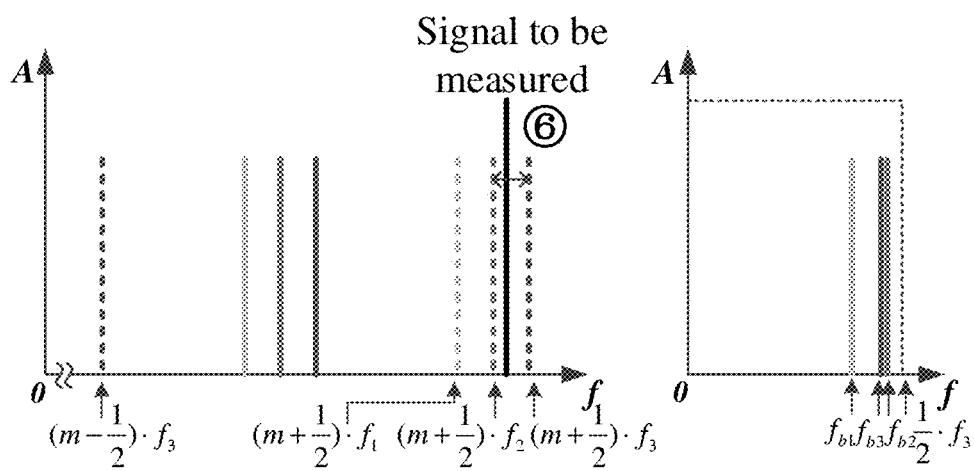
FIG. 12 shows the relative position between the signal to be measured and the m-th order comb lines in the frequency comb of the three optical pulses under the sixth condition in Embodiment 1 and the RF spectrum of the low frequency down converted signal.

In this embodiment, there are six cases for the relative position between the signal to be measured and the $m_{th}$-order comb lines (whose frequencies are $mf_1$, $mf_2$, $mf_3$ respectively) of the frequency combs generated by the triple-wavelength pulsed laser in the frequency axis and the corresponding spectrum distribution of the frequency mixed low-frequency beat note signals ($f_{b1}$, $f_{b2}$, $f_{b3}$). The first case to the sixth case are shown in FIG. 7, 8, 9, 10, 11, 12, respectively.

In this embodiment, the low-frequency beat note signal takes the minimum value and satisfies $f_{b1} \leq f_1/2$, $f_{b2} \leq f_2/2$, $f_{b3} \leq f_3/2$. In the first case, the frequency of signal to be measured $f_x$ satisfies $(m-\frac{1}{2}) \cdot f_3 < f_x < m \cdot f_1$ and the equation of $$m = \frac{f_{b2} - f_{b1}}{f_2 - f_1} = \frac{f_{b3} - f_{b1}}{f_3 - f_1} = \frac{f_{b3} - f_{b2}}{f_3 - f_2}$$

can be established. In the second case, the frequency of signal to be measured $f_x$ satisfies $m \cdot f_1 < f_x < m \cdot f_2$ and the equation of $$m = \frac{f_{b2} + f_{b1}}{f_2 - f_1} = \frac{f_{b3} + f_{b1}}{f_3 - f_1} = \frac{f_{b3} - f_{b2}}{f_3 - f_2}$$

can be established. In the third case, the frequency of signal to be measured $f_x$ satisfies $m \cdot f_2 < f_x < m \cdot f_3$ and the equation of $$m = \frac{f_{b1} - f_{b2}}{f_2 - f_1} = \frac{f_{b3} + f_{b1}}{f_3 - f_1} = \frac{f_{b3} + f_{b2}}{f_3 - f_2}$$

can be established. In the fourth case, the frequency of signal to be measured $f_x$ satisfies $m \cdot f_3 < f_x < (m+\frac{1}{2}) \cdot f_1$ and the equation of $$m = \frac{f_{b1} - f_{b2}}{f_2 - f_1} = \frac{f_{b1} - f_{b3}}{f_3 - f_1} = \frac{f_{b2} - f_{b3}}{f_3 - f_2}$$

can be established. In the fifth case, the frequency of signal to be measured $f_x$ satisfies $(m+\frac{1}{2}) \cdot f_1 < f_x < (m+\frac{1}{2}) \cdot f_2$ and the equation of $$m = \frac{f_1 - f_{b1} - f_{b2}}{f_2 - f_1} = \frac{f_1 - f_{b1} - f_{b3}}{f_3 - f_1} = \frac{f_{b2} - f_{b3}}{f_3 - f_2}$$

can be established. In the sixth case, the frequency of signal to be measured $f_x$ satisfies $(m+\frac{1}{2}) \cdot f_2 < f_x < (m+\frac{1}{2}) \cdot f_3$ and the equation $$m = \frac{f_1 - f_{b1} - (f_2 - f_{b2})}{f_2 - f_1} = \frac{f_1 - f_{b1} - f_{b3}}{f_3 - f_1} = \frac{f_2 - f_{b2} - f_{b3}}{f_3 - f_2}$$

of can be established.

In this embodiment, since more than three sets of optical pulse trains with different repetition rates are generated by the multi-repetition-rate pulsed light source, the relative position in frequency axis between the signal to be measured and the frequency combs is uniquely determined for a signal whose frequency is arbitrary, which means the value of m is uniquely determined. Therefore, the frequency of the electromagnetic signal to be measured can be uniquely determined, and dead-zone-free electromagnetic signal measurement can be realized. The theory can also be applied to other embodiments, such as a signal whose frequency varies linearly with time or a wideband signal.

In this embodiment, according to the values of $f_1$, $f_2$, $f_3$, $f_{b1}$, $f_{b2}$ and $f_{b3}$, it can be calculated that m=314 and the relative position of the signal $f_x$ and the comb lines from the three optical pulse trains in the frequency axis follows the fourth case at the moment, so the equation of $f_x = mf_1 + f_{b1} = 9999.99999993$ MHz can be established.

Figure 13:
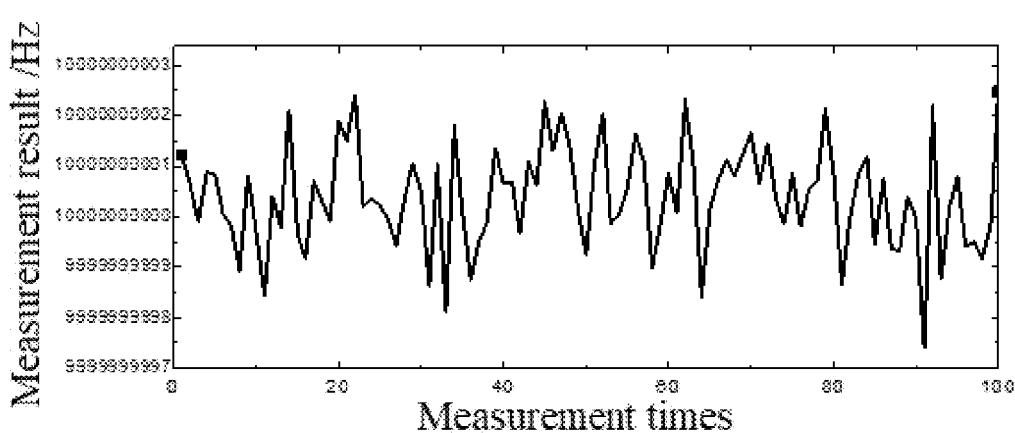
FIG. 13 is the measurement result of a 10-GHz-frequency signal in embodiment 1.

In this embodiment, the frequency of the signal to be measured is set to 10 GHz, and the power is set to 0 dBm. The signal to be measured is measured 100 times and the result of measurement is shown in FIG. 13. The mean value of the frequency after 100 measurements is 10000000.0218 Hz, the variance is 1.0306 Hz, and the deviation between the measured mean and the true value is 0.0218 Hz.

Figure 14:
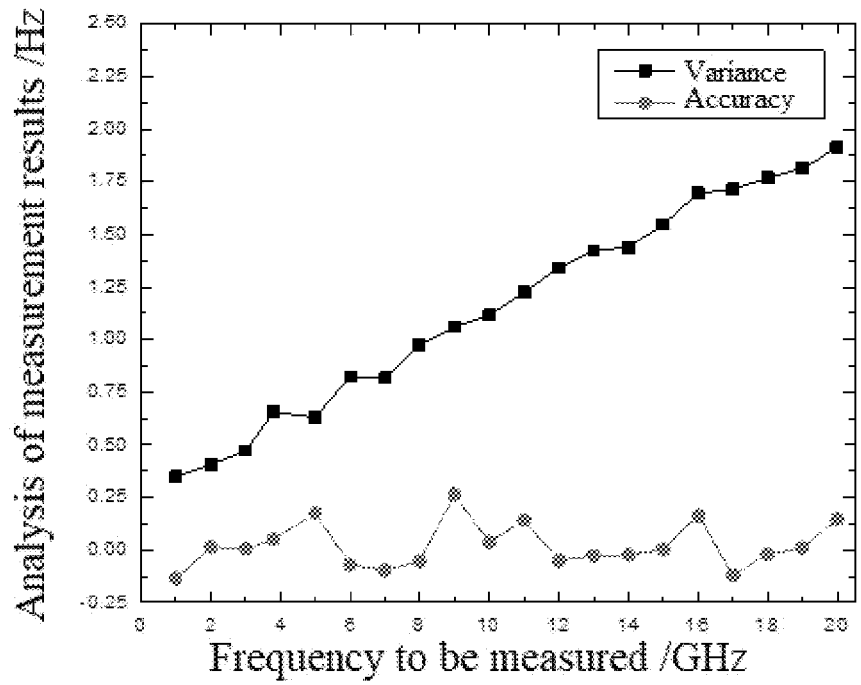
FIG. 14 is the variation of the variance and accuracy of the measurement result in relation to the frequency of the signal to be measured.

In this embodiment, the power of the signal to be measured is set to 0 dBm and the frequency is adjusted from 1 GHz to 20 GHz at intervals of 1 GHz. One hundred measurements are executed for each frequency point. The variation of the variance and accuracy of the measurement results in relation to the frequency of the signal to be measured is shown in FIG. 14. It can be seen that as the frequency changes from 1 GHz to 20 GHz, the variance of the measurement increases approximately linearly from approximately 0.3 Hz to approximately 2.0 Hz, and the accuracy of the measurement fluctuates within ±0.25 Hz.

Embodiments 2

Figure 15:
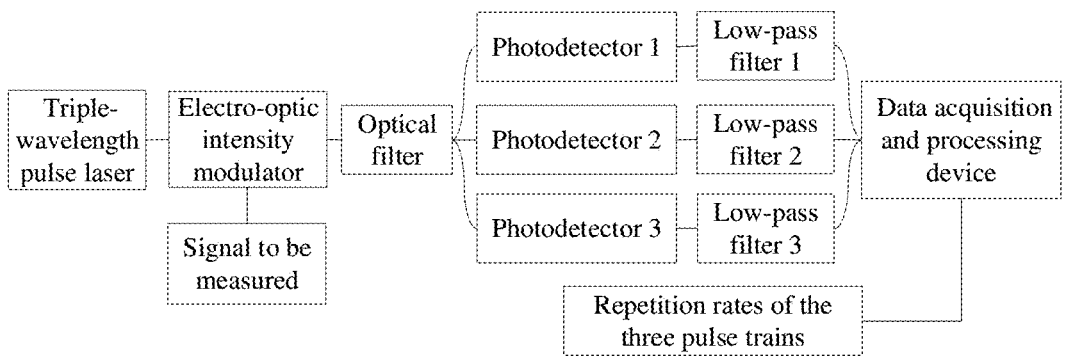
FIG. 15 is the schematic diagram of embodiment 2.

The schematic diagram of the apparatus in this embodiment is shown in FIG. 15. In this embodiment, the multi-repetition-rate pulsed light source is the same triple-wavelength pulsed laser as in embodiment 1. The frequency mixer includes electro-optical intensity modulator, optical filter, photoelectric detector 1, low-pass filter 1, photoelectric detector 2, low-pass filter 2, photoelectric detector 3 and low-pass filter 3.

Instead of using repetition-rate measuring device, the repetition rates of the three optical pulse trains are premeasured and directly input into the data acquisition and processing device.

In this embodiment, the signal to be measured can be time-varying signal. It can be linear frequency modulated signal, frequency modulated signal, frequency hopping signal, frequency sweeping signal, etc. The characteristic of the signal to be measured is that its frequency or frequency component varies with time.

In this embodiment, the triple-wavelength pulses generated by triple-wavelength pulsed laser are input into the electro-optical intensity modulator, and are modulated by the signal to be measured, and then pass through the optical filter to separate the modulated three pulse trains with different center wavelengths. The output spectra of the three channels of the optical filter only contain single peaks with central wavelengths of $\lambda_1$, $\lambda_2$ and $\lambda_3$, respectively. The three optical pulse trains of center wavelengths $\lambda_1$, $\lambda_2$ and $\lambda_3$ and repetition rates of $f_1$, $f_2$ and $f_3$ are separated and respectively input into photodetector 1 and low-pass filter 1, photodetector 2 and low-pass filter 2, photodetector 3 and low-pass filter 3 to obtain frequency mixed signal 1, frequency mixed signal 2 and frequency mixed signal 3. Then the frequency mixed signals 1, 2 and 3 are simultaneously input into data acquisition and processing device.

In this embodiment, the frequency of the signal to be measured varies continuously and linearly with time. In the frequency mixing process, the signal to be measured mixes with the comb lines of the three frequency combs generated by the three pulse trains with different repetition rates and generates low-frequency beat note signals respectively. The order of the comb line which mixes with the signal to be measured and generates low frequency beat note signals varies with the frequency of the signal to be measured and the beat note signals vary continuously with time.

In this embodiment, the data acquisition and processing device simultaneously acquires and records the low-frequency beat note signals output by low-pass filter 1, 2 and 3. Hilbert transform algorithm is used to calculate the frequencies of the three time-varying beat note signals. By comparing with the repetition rates and their differences of the three optical pulse trains, the order of the optical comb line which mixes with the signal to be measured and generates low-frequency beat note signals can be calculated at any time during the measurement, and then the frequency value of the signal to be measured at that moment can be calculated, so that the time dependent variation curve of the frequency of the time-varying signal to be measured can be calculated. The data can also be processed using one or more data processing algorithms selected from FIR filter, IIR filter, fast convolution, Fourier Transform, Fourier Inverse Transform, Short-Time Fourier Transform, Wavelet Transform, Hilbert Transform, Hilbert-Huang Transform, sine curve fitting, Ricker wavelet matching, S Transform, Cohen bilinear transformation, adaptive filtering methods according to different requirements for time resolution, spatial resolution and multi-frequency signal recognition ability and then combined with the value of repetition rates of three optical pulse trains to accurately measure the signal to be measured.

Embodiments 3

Figure 16:
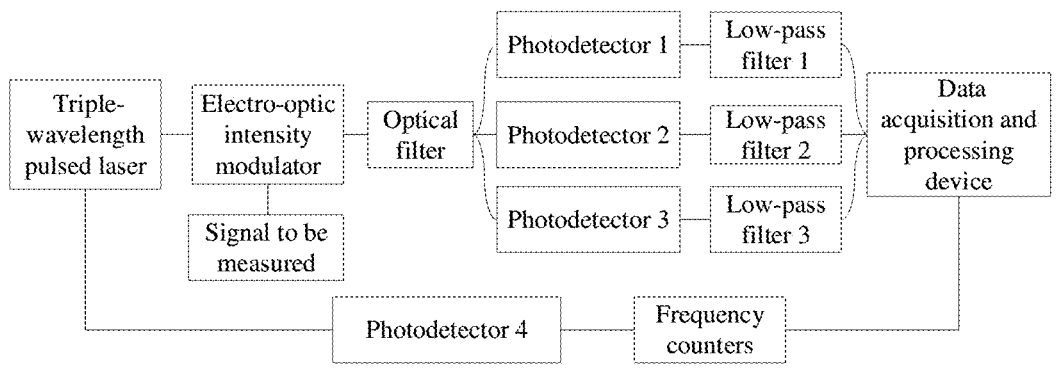
FIG. 16 is the schematic diagram of embodiment 3.

The schematic diagram of the system in this embodiment is shown in FIG. 16. In this embodiment, multi-repetition-rate pulsed light source is a triple-wavelength pulsed light source. It generates three optical pulse trains and the corresponding frequency combs mix with the signal to be measured and generate three low frequency beat note signals in the frequency mixer. In this embodiment, the signal to be measured has wide bandwidth. The repetition-rate measurement devices are photo detector and frequency counter, which measure the repetition rates of the three optical pulse trains and input the information into the data acquisition and processing device.

The signal to be measured is a broad band signal, and the range of the frequency of the signal is known or limited to several possible frequency intervals. By using the data acquisition and processing device, the mapping between the known or possible frequency distribution of the signal to be measured and the corresponding intervals of the three low-frequency beat note signals can be established according to the repetition rates of the three optical pulse trains, and then the spectrum of the signal to be measured can be retrieved through the spectra of the three low-frequency beat note signals.

In this embodiment, the signal to be measured can be a broad band signal with sparse spectrum. When the spectra of the three low-frequency beat note signals are not aliased, the different frequency values of the same position in the spectrum profiles of the three low-frequency beat note signals can be measured, and the frequency value of this point in the spectrum of the signal to be measured can be measured by the method described in embodiment 1, then the frequency band of this spectral profile in the signal to be measured can be determined according to this frequency value. When the spectrum of the three low-frequency beat note signals are aliased, a certain threshold can be set to determine the non-signaled frequency band of the three low-frequency beat note signals, and the non-signaled frequency band of the signal to be measured can be calculated according to the repetition rates of three optical pulse trains. If the sampling linear equations of the frequency spectra of the low-frequency beat note signals and the spectrum of the signal to be measured have a unique solution (or the sampling matrix is full rank), the frequency spectrum of the signal to be measured can be uniquely determined by the frequency spectrum of the low-frequency signal to be measured. If the unique solution cannot be obtained, the spectra of the three low-frequency beat note signals can be compared, then the maximum likelihood estimation of the frequency band distribution of the measured signal can be made according to the repetition rates and their difference of the three pulse trains, and the calculated spectrum of the signal to be measured can be verified.

Figure 17:
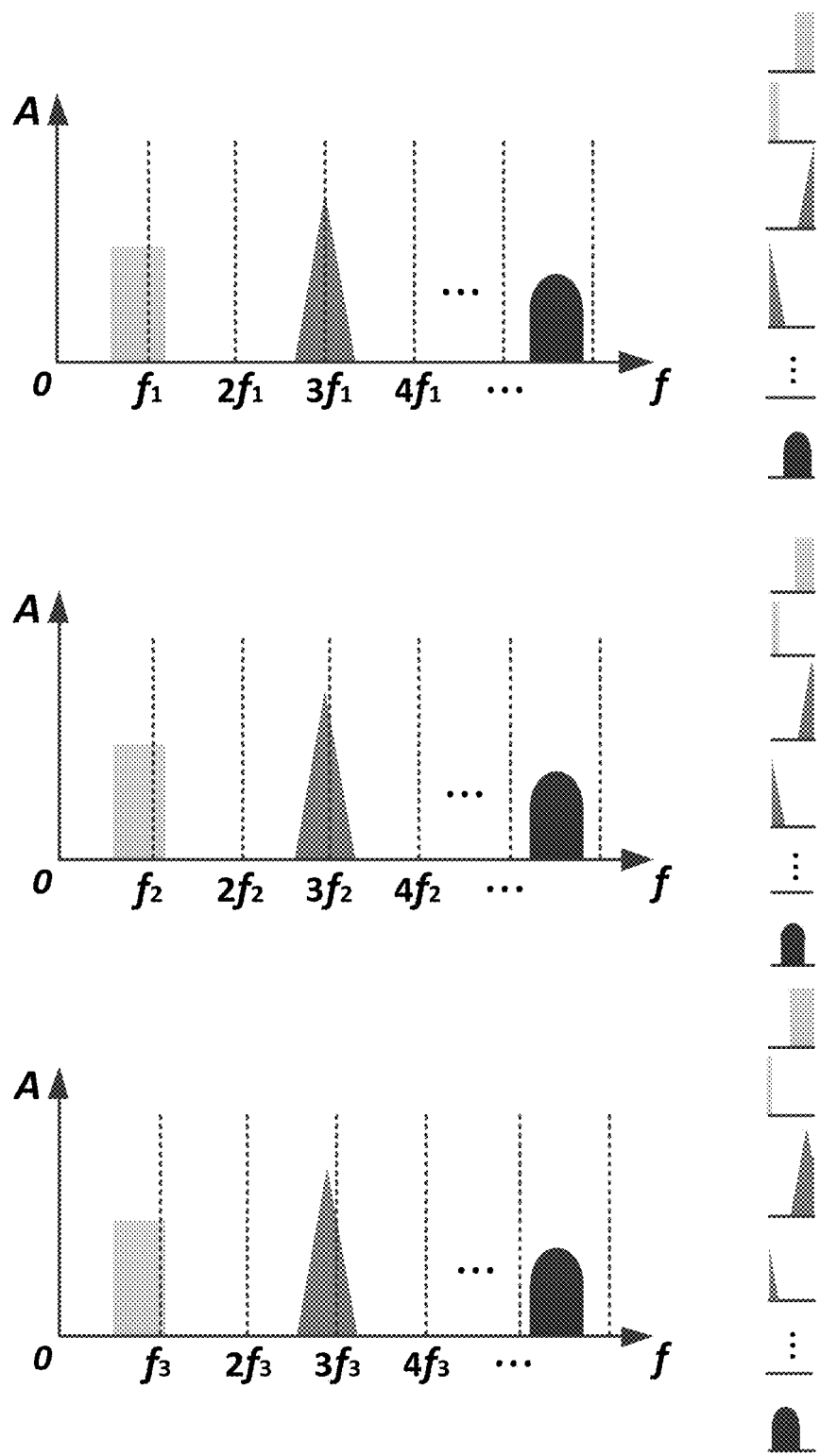
FIG. 17 is the schematic diagram of the sampling process of the spectrum of the signal to be measured in embodiment 3.

The schematic diagram of spectrum sampling process of the signal to be measured is shown in FIG. 17. The spectrum of the signal to be measured is divided into several frequency blocks by the optical comb lines generated by the optical pulse trains, where the spectral width of the frequency blocks are the repetition rates of the pulse trains and the low-frequency beat note signals are the superposition of these frequency blocks. By using the three optical frequency combs generated by three pulse trains output by the triple-wavelength pulsed laser, the spectrum of the signal to be measured can be divided for three times with frequency blocks of different bandwidth, and the frequency blocks are stitched to obtain the low-frequency beat signals. According to the repetition rates and repetition rates difference of the three optical pulse trains measured by the photodetector and frequency counter, the spectrum of the signal to be measured can be reconstructed.

Embodiments 4

Figure 18:
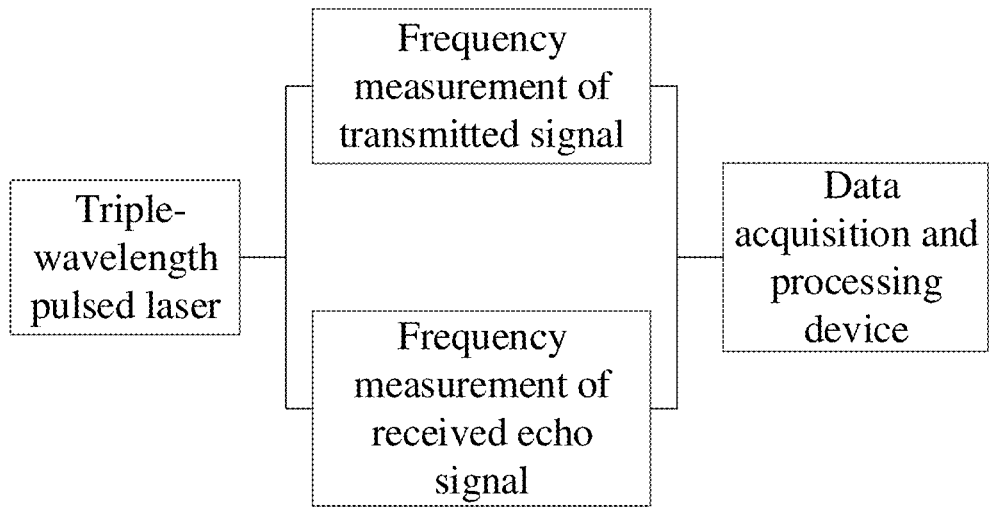
FIG. 18 is the schematic diagram of embodiment 4.

FIG. 18 shows a schematic diagram of this embodiment. In this embodiment, multi-repetition-rate pulsed light source is a triple-wavelength pulsed laser. Similar frequency measurement method in embodiment 1 is used to measure both the frequency of the transmitted signal and the echo signal received after reflected by the object. If the frequency of the transmitted signal is known, it's only necessary to measure the frequency of the echo signal. If the frequency of the transmitted signal is known, it's only necessary to measure the frequency difference of the low-frequency beat note signals which are generated by mixing the transmitted signal and the echo signal with the optical frequency combs generated by the multi-repetition-rate pulsed light source respectively. By inputting the frequency of transmitted signal and received echo signal into the data acquisition and processing device, the Doppler frequency shift, the direction of relative motion of the object and the radial velocity of relative motion can be calculated. Let $f_m$ and $f_m'$ be the frequency of transmitting signal and echo signal respectively, then the Doppler frequency shift is $f_D = \Delta f/2 = |f_m - f_m'|/2$, and the radial velocity of relative movement is $v = cf_D/2f_m = c\Delta f/4f_m$.

Embodiments 5

Figure 19:
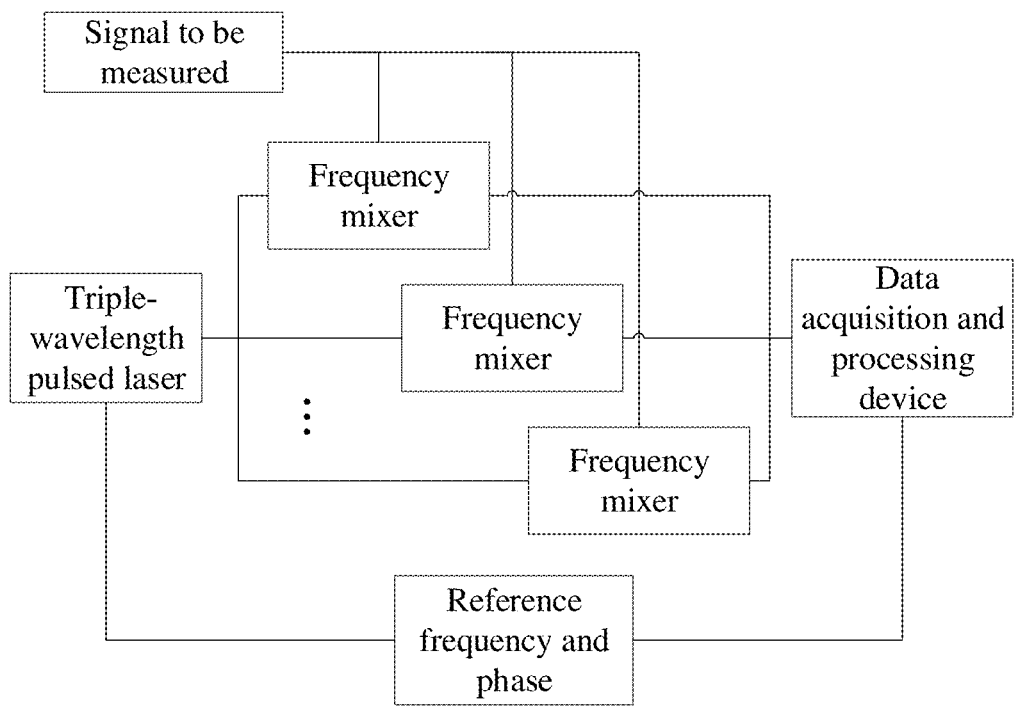
FIG. 19 is the schematic diagram of embodiment 5.

The schematic diagram of the system in this embodiment is shown in FIG. 19. In this embodiment, the multi-repetition-rate pulsed light source is a triple-wavelength mode-locked laser. The frequency, amplitude and phase of the signal to be measured are measured at multiple locations in space by using a triple-wavelength mode-locked laser, one or more frequency mixers, data acquisition and processing device. The measurement method for the signal to be measured at each location is the same as that for embodiment 1. Another method is to input the reference frequency and phase or reference phase into the data acquisition and processing device, then calculate the phase difference of the signal to be measured which is measured and received at two or more positions, or the phase difference between the phase of the signal to be measured and the reference phase received at one or more locations. By simultaneously inputting the frequency of the signal to be measured, the distance between different receiving locations and the phase difference mentioned before into the data acquisition and processing device, the arrival angle of the signal to be measured can be calculated. The angle of arrival of the signal to be measured can also be measured at different locations at the same time, so as to calculate the distance of the signal to be measured. In addition, by measuring the amplitude and phase of signals to be measured at various locations in space, the wave front and wave surface of the signals to be measured can be analyzed to determine the location of signal radiation sources so as to determine the spatial position of signal sources.

What is claimed is:

1. A system for time-frequency characteristics measurement of a high frequency electromagnetic signal, comprising:
    a multi-repetition-rate pulsed light source;
    a frequency mixer for electrical and optical signal;
    a repetition-rate measurement device; and
    a data acquisition and processing device;
    wherein the multi-repetition-rate pulsed light source simultaneously generates three or more optical pulse trains with different repetition rates through periodic spectrum filtering in an optical cavity, the three or more optical pulse trains forming three or more spatially overlapped optical frequency combs in the same optical cavity, wherein the three or more spatially overlapped optical frequency combs have different frequency intervals equal to the repetition rates of the corresponding optical pulse trains;
    wherein the three or more optical pulse trains and the signal to be measured are mixed in the frequency mixer, and three or more frequency mixed signals are respectively generated;
    wherein the repetition-rate measurement device measures the repetition rates of the three or more optical pulse trains in real time;
    wherein the data acquisition and processing device simultaneously acquires the three or more frequency mixed signals generated by the frequency mixer and the repetition rates measured by the repetition-rate measurement device and determines relative position of the frequency of the signal to be measured and comb lines of each optical frequency comb through data processing so as to obtain the time-frequency characteristics of the signal to be measured.

2. The system of claim 1, wherein the three or more optical pulse trains have different modes, polarization states, center wavelengths, transmission directions, or nonlinear effects in the optical cavity of the multi-repetition-rate pulsed light source.

3. The system of claim 2, wherein the three or more optical pulse trains have different transmission delay or phase delay due to their differences in modal dispersion, polarization mode dispersion, birefringence, chromatic dispersion, nonlinear effect or mode-lock mechanism in the optical cavity, which enables the simultaneous generation of several optical pulse trains with different repetition rates in a single laser cavity.

4. The system of claim 1, wherein the frequency mixer is a combination of an optical frequency mixer and a photo-detector device or a photoconductive antenna.

5. The system of claim 4, wherein the optical frequency mixer is an optical intensity modulator, an optical phase modulator, an optical polarization modulator, a nonlinear crystal, a nonlinear optical fiber, a nonlinear waveguide, an acousto-optic modulator, a magneto-optical modulator, an optical coupler, an optical filter, or their combinations.

6. The system of claim 1, wherein the repetition-rate measurement device measures frequency information of the three or more optical pulse trains.

7. The system of claim 1, wherein the data acquisition and processing device calculates the frequency, amplitude, phase or their variations of the signal to be measured in accordance to the frequency, amplitude or phase of the three or more frequency mixed signals generated by the frequency mixer.

8. A method for time-frequency characteristics measurement of a high frequency electromagnetic signal, comprising the steps of:
    providing a multi-repetition-rate pulsed light source for simultaneously generating three or more optical pulse trains with different repetition rates through periodic spectrum filtering in an optical cavity, the three or more optical pulse trains forming three or more spatially overlapped optical frequency combs in the same optical cavity, wherein the three or more spatially overlapped optical frequency combs have different frequency intervals equal to the repetition rates of the corresponding optical pulse trains;

inputting the three or more optical pulse trains and the signal to be measured into a frequency mixer to obtain three or more frequency mixed signals, wherein the frequencies of the three or more frequency mixed signals are not larger than half of the repetition rates of the corresponding optical pulse trains;

inputting the three or more optical pulse trains into a repetition-rate measurement device to obtain the repetition rate information of the three or more optical pulse trains; and providing a data acquisition and processing device for obtaining the frequency domain characteristics of the frequency, amplitude, phase or their variations of the three or more frequency mixed signals, and calculating spectrum information of the signal to be measured including the frequency, amplitude, phase distribution or their variations in accordance to the repetition rate information of the three or more optical pulse trains and the frequency domain characteristics of the three or more frequency mixed signals.

9. The method of claim 8, wherein the data acquisition and processing device uniquely determines relative position between the frequency of the signal to be measured and the frequencies of the three or more optical frequency combs in accordance to the repetition rate information of the three or more optical pulse trains and the frequencies of the three or more frequency mixed signals.

10. The method of claim 8, wherein the signal to be measured is a time-varying signal, and the data acquisition and processing device can uniquely determine the time-varying frequency domain characteristics of the signal to be measured in accordance to the repetition rate information of the three or more optical pulse trains and the time-varying frequency domain characteristics of the three or more frequency mixed signals.

11. The method of claim 8, wherein the signal to be measured has wide bandwidth, and the data acquisition and processing device determines frequency domain characteristics of the signal to be measured in accordance to the repetition rate information of the three or more optical pulse trains and spectral shapes of the three or more frequency mixed signals.

* * * * *